(12) United States Patent
Wang (10) Patent No.: US 8,778,791 B2
(45) Date of Patent: Jul. 15, 2014

(54) SEMICONDUCTOR STRUCTURE AND METHOD FOR MAKING THE SAME

(71) Applicant: Meng-Jen Wang, Kaohsiung (TW)

(72) Inventor: Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 62 days.

(21) Appl. No.: 13/759,899

(22) Filed: Feb. 5, 2013

(65) Prior Publication Data

US 2013/0143360 A1 Jun. 6, 2013

Related U.S. Application Data

(62) Division of application No. 12/794,294, filed on Jun. 4, 2010, now Pat. No. 8,415,807.

(30) Foreign Application Priority Data

Dec. 3, 2009 (TW) .............................. 98141397 A (51) Int. Cl.
*H01L 23/48* (2006.01)
(52) U.S. Cl.
USPC ............ 438/613; 257/E21.499; 257/E23.011; 257/773; 438/107; 438/637
(58) Field of Classification Search
USPC ................... 257/686, 777; 438/613, 107, 637
See application file for complete search history.

(56) References Cited

U.S. PATENT DOCUMENTS

| 5,270,261 A | 12/1993 | Bertin et al. |
| 7,939,369 B2 | 5/2011 | Farooq et al. |
| 2009/0134527 A1* | 5/2009 | Chang ........................... 257/777 |
| 2010/0176501 A1 | 7/2010 | Zaccardi |
| 2011/0031597 A1 | 2/2011 | Landau et al. |
| 2011/0031599 A1* | 2/2011 | Jo ................................. 257/686 |

FOREIGN PATENT DOCUMENTS

| CN | 101258596 | 9/2008 |
| TW | I248178 | 1/2006 |
| TW | 200903773 | 1/2009 |

OTHER PUBLICATIONS

SIPO Office Action with translation summary, dated Feb. 13, 2012, for Chinese Patent Application No. 200910258551.7 (9 pages).
SIPO Office Action with translation summary, dated Oct. 25, 2012, for Chinese Patent Application No. 200910258551.7, Applicant, Advanced Semiconductor Engineering, Inc. (10 pages).
TWIPO Office Action with translation summary, dated Nov. 19. 2012, for Taiwan Patent Application No. 098141397, Applicant, Advanced Semiconductor Engineering, Inc. (12 pages).

* cited by examiner

*Primary Examiner* — S. V. Clark
*Assistant Examiner* — Krista Soderholm
(74) *Attorney, Agent, or Firm* — McCracken & Frank LLC (57) ABSTRACT

The present invention relates to a semiconductor structure and a method for making the same. The method includes the following steps: (a) providing a first wafer and a second wafer; (b) disposing the first wafer on the second wafer; (c) removing part of the first wafer, so as to form a groove; (d) forming a through via in the groove; and (e) forming at least one electrical connecting element on the first wafer. Therefore, the wafers are penetrated and electrically connected by forming only one conductive via, which leads to a simplified process and a low manufacturing cost.

12 Claims, 13 Drawing Sheets

SEMICONDUCTOR STRUCTURE AND METHOD FOR MAKING THE SAME

BACKGROUND OF THE INVENTION

1. Field of the Invention

The present invention relates to a semiconductor structure and a method for making the same, and more particularly to a semiconductor structure having a through via and a method for making the same.

2. Description of the Related Art

Figure 1:
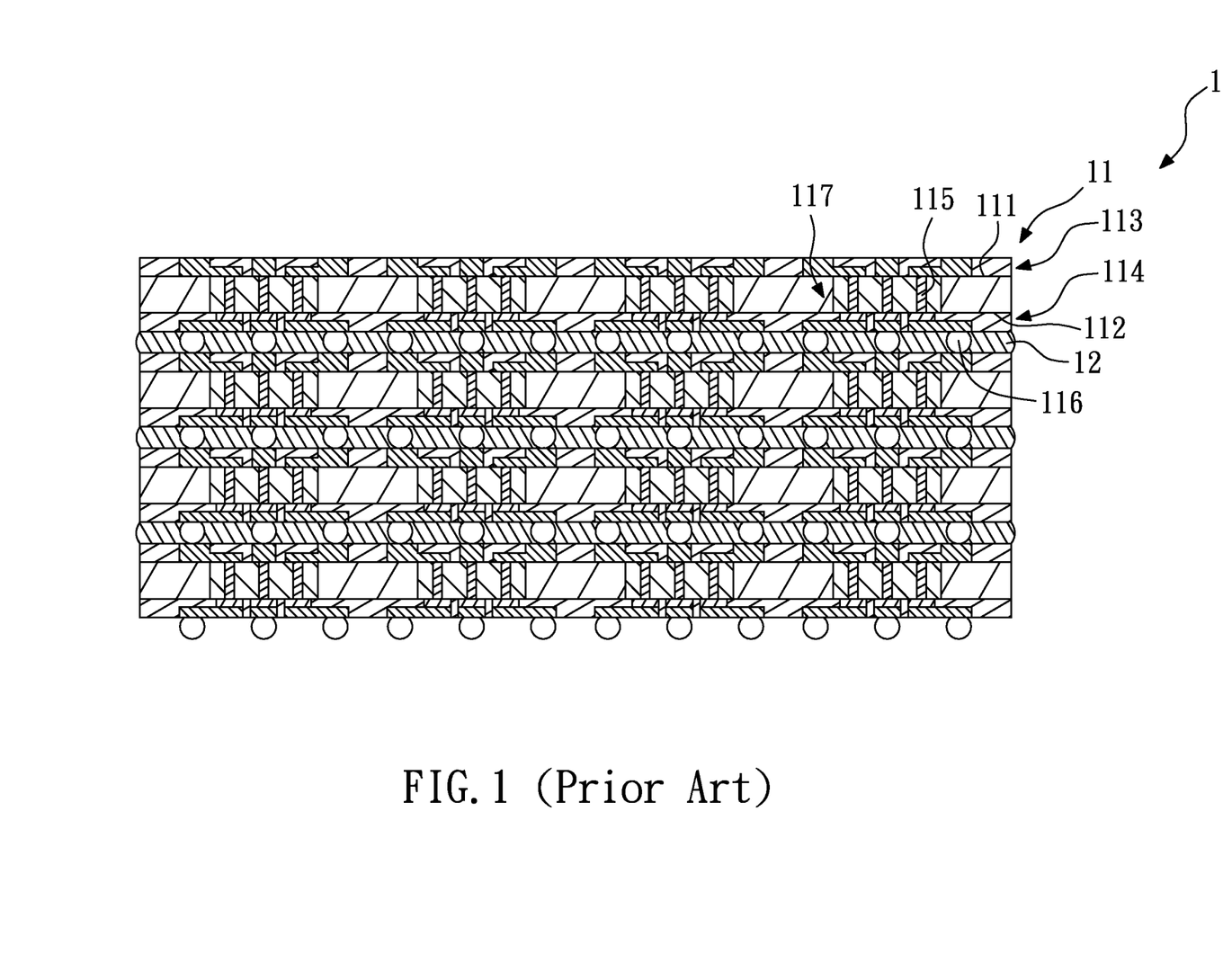
FIG. 1 is a cross-sectional view of a conventional semiconductor structure.

FIG. 1 shows a cross-sectional view of a conventional semiconductor structure. The conventional semiconductor structure 1 has a plurality of wafers 11 and an underfill 12. Each of the wafers 11 has a first surface 111, a second surface 112, a first redistribution layer (RDL) 113, a second redistribution layer (RDL) 114, a plurality of chips 117, a plurality of through vias 115 and a plurality of bumps 116. The first redistribution layer (RDL) 113 is disposed on the first surface 111. The second redistribution layer (RDL) 114 is disposed on the second surface 112. The chips 117 are disposed in the wafer 11, and exposed to the first surface 111 and the second surface 112. The through vias 115 are disposed in the chips 117, exposed to the first surface 111 and the second surface 112, and electrically connect the first redistribution layer (RDL) 113 and the second redistribution layer (RDL) 114. The humps 116 are disposed on the second redistribution layer (RDL) 114, and electrically connected to the through vias 115. The underfill 12 is disposed between two adjacent wafers 11, and encapsulates the bumps 116, so as to connect the wafers 11.

The conventional semiconductor structure 1 has the following disadvantages. The conventional semiconductor structure 1 is formed by stacking the wafers 11. For electrically connecting the chips 117, the through vias 115 are formed in each chip 117, and then the first redistribution layer (RDL) 113, the second redistribution layer (RDL) 114 and the bumps 116 are formed in each wafer 11, which leads to a high manufacturing cost. Moreover, the pitch between the bumps 116 of the wafers 11 is narrowed to reduce the size of the product, so the underfill 12 is difficult to fill up the gap between the bumps 116 and encapsulate the bumps 116 when the wafers 11 are connected. Thus the yield rate of the product is reduced.

Therefore, it is necessary to provide a semiconductor structure and a method for making the same to solve the above problems.

SUMMARY OF THE INVENTION

The present invention is directed to a semiconductor structure. The semiconductor structure comprises a second chip, a first chip, a groove, a through via and at least one electrical connecting element. The second chip has a second active surface and at least one second conductive pad. The second conductive pad is exposed to the second active surface. The first chip is disposed on the second chip, and has a first active surface and at least one first conductive pad. The first conductive pad is exposed to the first active surface, and has at least one through hole. The groove is disposed in the first chip, communicates with the through hole of the first conductive pad, and exposes the first conductive pad and the second conductive pad. The through via is disposed in the groove, and electrically connects the first conductive pad and the second conductive pad. The electrical connecting element is disposed on the first chip, and electrically connected to the through via.

The present invention is further directed to a semiconductor structure. The semiconductor structure comprises a second chip, a third chip, a first chip, at least one first conductive pad, a groove, a through via and at least one electrical connecting element. The second chip has a second active surface and at least one second conductive pad. The second conductive pad is exposed to the second active surface. The third chip is disposed on the second chip, and has a third active surface. The first chip is disposed on the third chip, and has a first active surface. The first conductive pad has at least one through hole, and is disposed in the first chip or the third chip. The groove is disposed in the first chip and the third chip, communicates with the through hole of the first conductive pad, and exposes the first conductive pad and the second conductive pad. The through via is disposed in the groove, and electrically connects the first conductive pad and the second conductive pad. The electrical connecting element is disposed on the first chip, and electrically connected to the through via.

The present invention is further directed to a method for making a semiconductor structure. The method comprises the following steps: (a) providing a first wafer and a second wafer, wherein the first wafer has a first active surface and at least one first conductive pad, the first conductive pad is exposed to the first active surface, and has at least one through hole, the second wafer has a second active surface and at least one second conductive pad, the second conductive pad is exposed to the second active surface; (b) disposing the first wafer on the second wafer; (c) removing part of the first wafer, so as to form a groove, wherein the groove communicates with the through hole of the first conductive pad, and exposes the first conductive pad and the second conductive pad; (d) forming a through via in the groove, wherein the through via electrically connects the first conductive pad and the second conductive pad; and (e) forming at least one electrical connecting element on the first wafer, wherein the electrical connecting element is electrically connected to the through via.

The present invention is further directed to a method for making a semiconductor structure. The method comprises the following steps: (a) providing a first wafer, a third wafer, a second wafer and at least one first conductive pad, wherein the first wafer has a first active surface, the third wafer has a third active surface, the second wafer has a second active surface and at least one second conductive pad, the second conductive pad is exposed to the second active surface, the first conductive pad has at least one through hole and is disposed in the first wafer or the third wafer; (b) disposing the third wafer on the second wafer, and disposing the first wafer on the third wafer; (c) removing part of the first wafer and part of the third wafer, so as to form a groove, wherein the groove communicates with the through hole of the first conductive pad, and exposes the first conductive pad and the second conductive pad; (d) forming a through via in the groove, wherein the through via electrically connects the first conductive pad and the second conductive pad; and (e) forming at least one electrical connecting element on the first wafer, wherein the electrical connecting element is electrically connected to the through via.

Therefore, in the present invention, the wafers or the chips are penetrated and electrically connected by forming only one through via, which leads to a simplified process and a low manufacturing cost. Moreover, in the present invention, the wafers and the chips are connected directly or by a bonding material, and a plurality of bumps are not needed. Therefore, the present invention avoids the disadvantage that the underfill can not completely encapsulate the bumps, and the yield rate is increased.

DETAILED DESCRIPTION OF THE INVENTION

Figure 2:
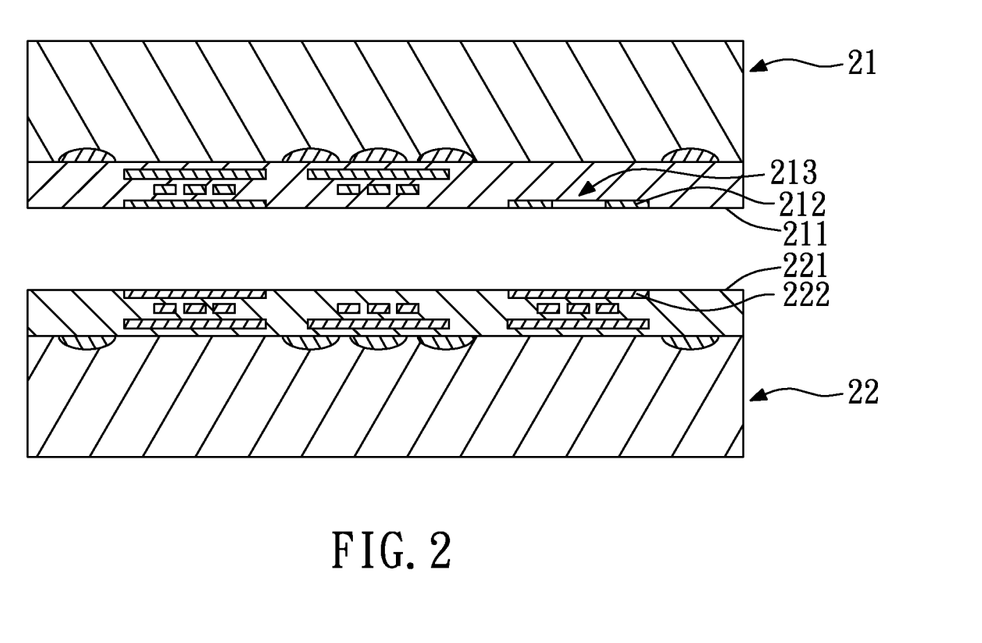
FIGS. 2 to 12 are schematic views of a method for making a semiconductor structure according to a first embodiment of the present invention.
Figure 3:
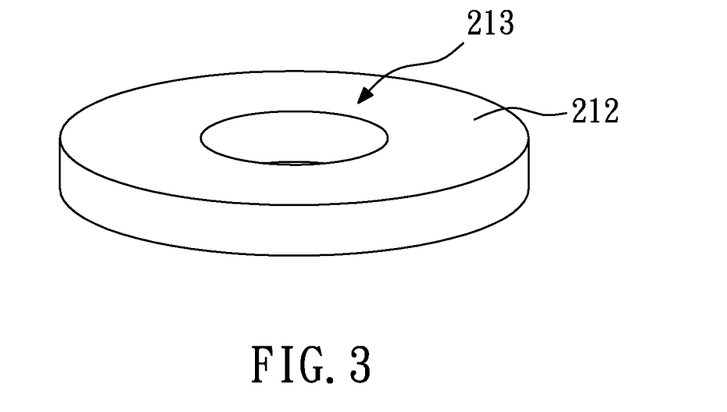
Figure 4:
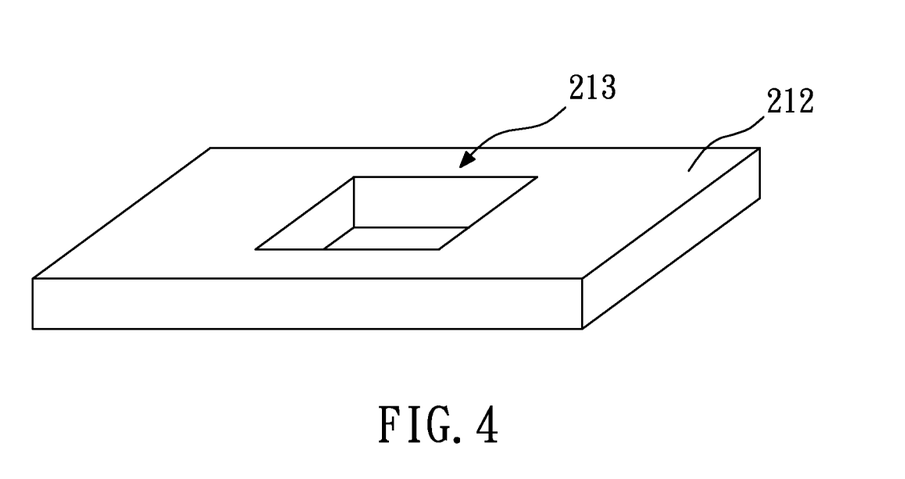
Figure 5:
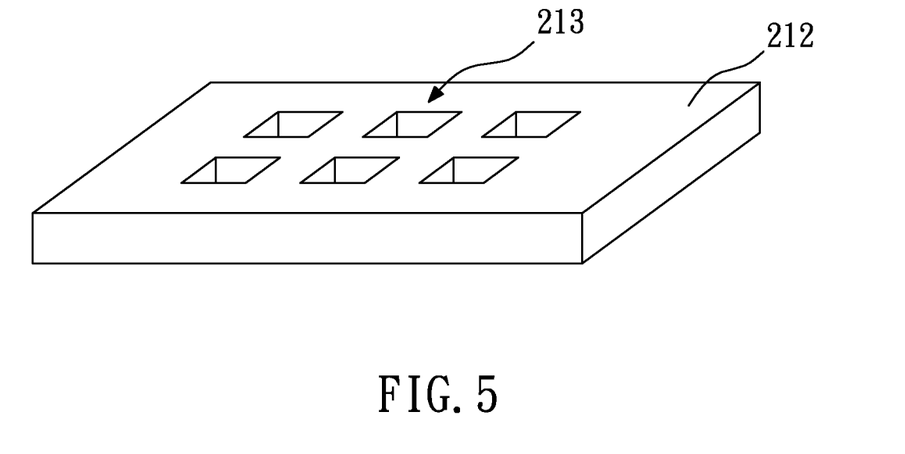

FIGS. 2 to 12 show schematic views of a method for making a semiconductor structure according to a first embodiment of the present invention. As shown in FIG. 2, a first wafer 21 and a second wafer 22 are provided. The first wafer 21 has a first active surface 211, at least one first conductive pad 212 and a first back surface opposite to the first active surface 211. The first conductive pad 212 is exposed to the first active surface 211, and has at least one through hole 213. The second wafer 22 has a second active surface 221 and at least one second conductive pad 222. The second conductive pad 222 is exposed to the second active surface 221. In this embodiment, the shape of the first conductive pad 212 and the through hole 213 thereof is circular, and the through hole 213 is disposed at the center of the first conductive pad 212, as shown in FIG. 3. However, in other embodiments, the shape of the first conductive pad 212 and the through hole 213 thereof can be square, and the through hole 213 is disposed at the center of the first conductive pad 212, as shown in FIG. 4, alternatively, the first conductive pad 212 has a plurality of through holes 213, as shown in FIG. 5.

Figure 6:
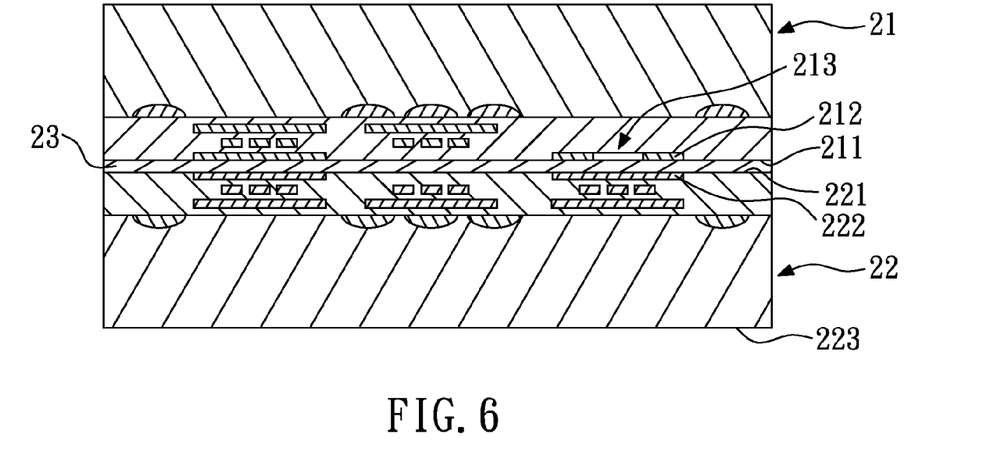

As shown in FIG. 6, the first wafer 21 is disposed on the second wafer 22. In this embodiment, the first wafer 21 and the second wafer 22 are connected by a bonding material 23, and the second active surface 221 of the second wafer 22 faces the first active surface 211 of the first wafer 21. The material of the bonding material 23 is silicon oxide (SiO$_2$) or benzocyclobutene (BCB). However, in other embodiments, the first wafer 21 and the second wafer 22 can be connected by anodic bonding. In another embodiment, the second wafer 22 may further comprises a second back surface 223, and the second back surface 223 of the second wafer 22 faces the first active surface 211 of the first wafer 21, that is, in comparison with FIG. 6, the second wafer 22 is reversed upside down.

Figure 7:
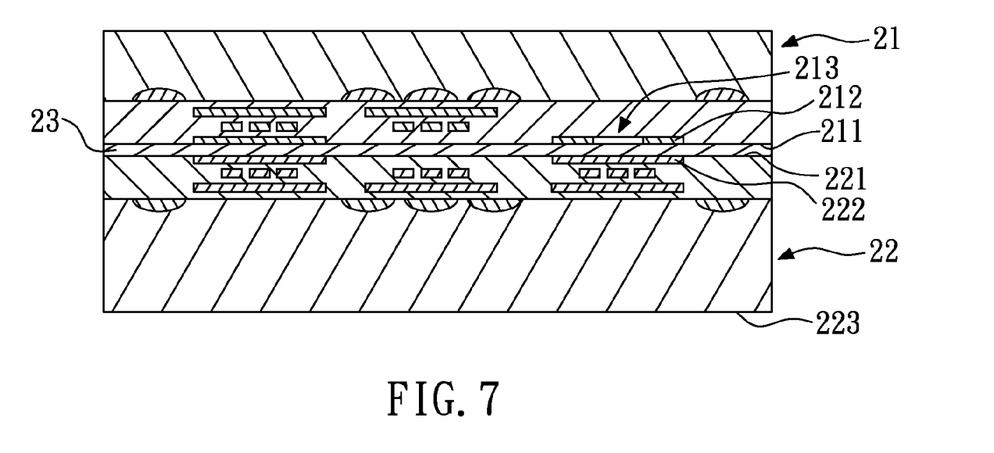
Figure 8:
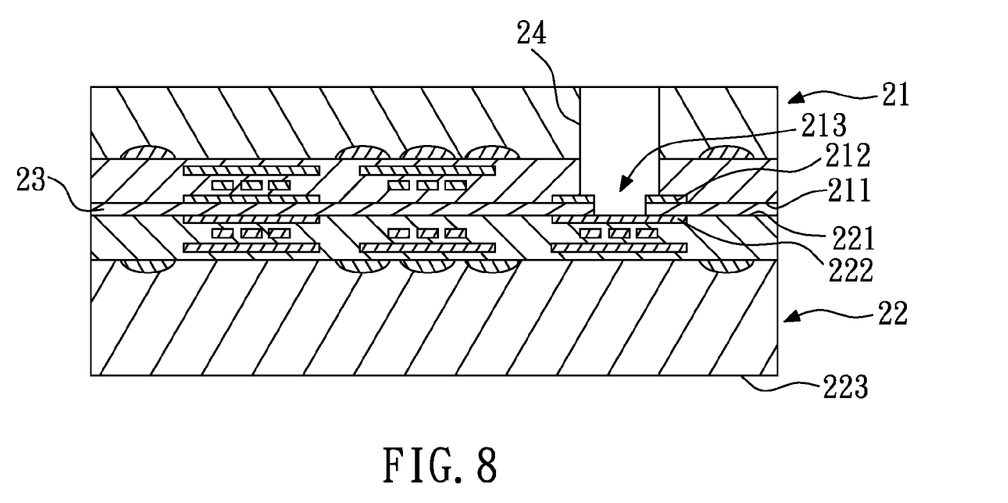

As shown in FIG. 7, preferably, part of the first wafer 21 is removed, so as to reduce the thickness of the first wafer 21. As shown in FIG. 8, part of the first wafer 21 is removed, so as to form a groove 24. The groove 24 communicates with the through hole 213 of the first conductive pad 212, and exposes the first conductive pad 212 and the second conductive pad 222. In this embodiment, part of the first wafer 21 is removed by dry etching, and SF6 or CF4 is used as the etching gas of dry etching.

The cross-sectional area of the groove 24 is smaller than or equal to those of the first conductive pad 212 and the second conductive pad 222, and the cross-sectional area of the groove 24 is larger than or equal to that of the through hole 213 of the first conductive pad 212. However, in other embodiments, under the situation described above "the second back surface 223 of the second wafer 22 faces the first active surface 211 of the first wafer 21", part of the second wafer 22 must be removed at the same time, so as to form the groove 24 in order to expose the second conductive pad 222.

Figure 9:
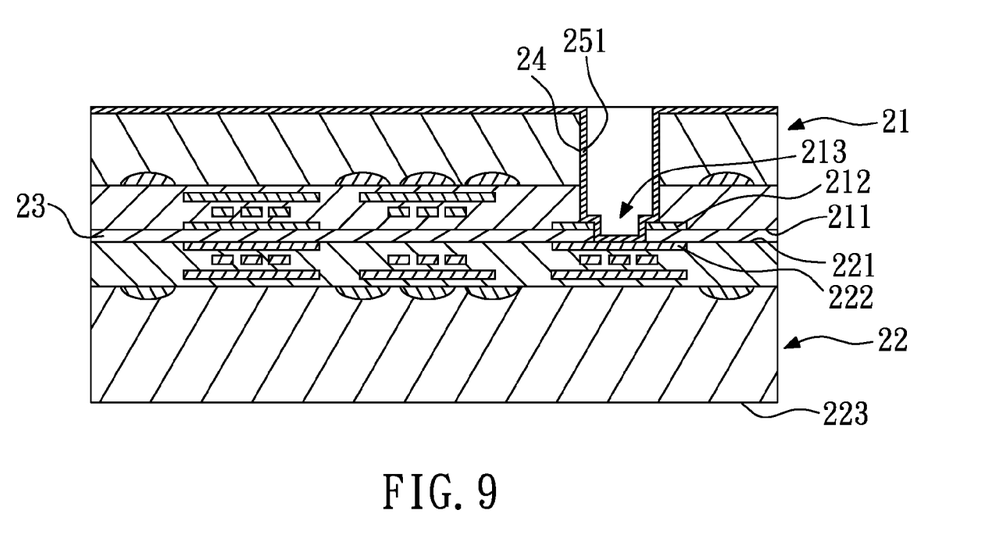
Figure 10:
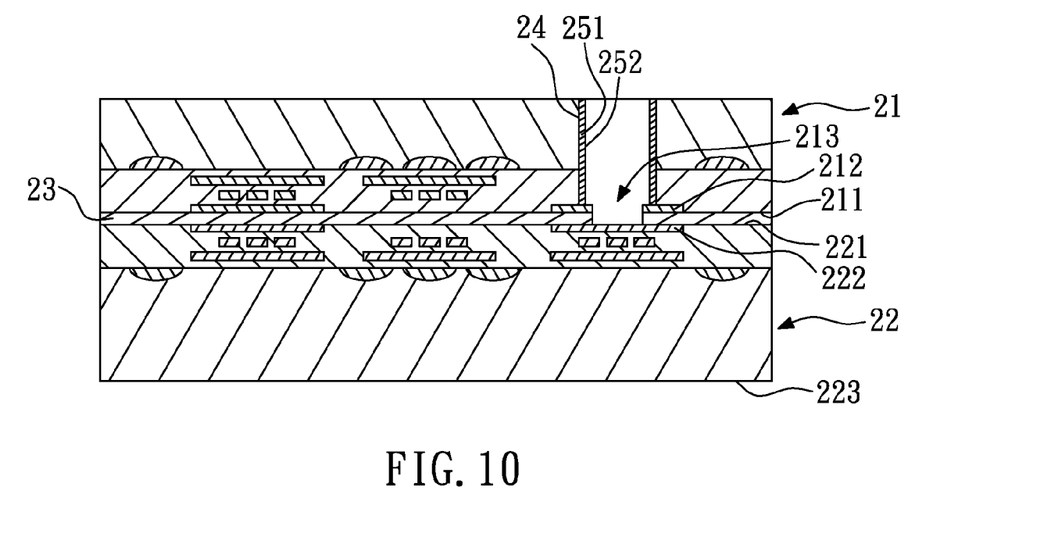
Figure 11:
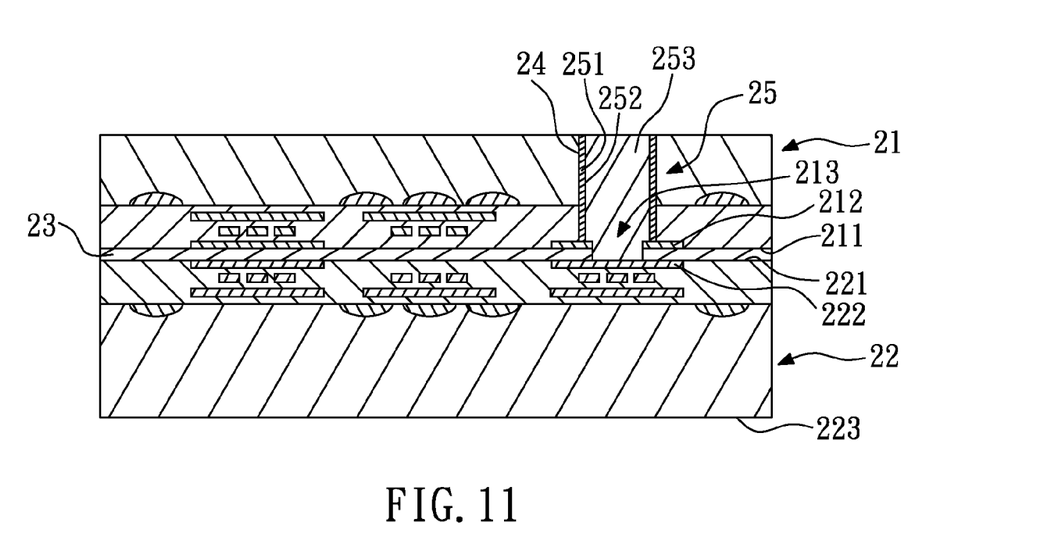

As shown in FIGS. 9 to 11, a through via 25 (FIG. 11) is formed in the groove 24, and the through via 25 electrically connects the first conductive pad 212 and the second conductive pad 222. In this embodiment, the method for forming the through via 25 is described below. As shown in FIG. 9, a first insulating layer 251 is formed on the first wafer 21. As shown in FIG. 10, part of the first insulating layer 251 is removed, so as to expose the first conductive pad 212 and the second conductive pad 222. As a result, only the first insulating layer 251 disposed on the side wall of the groove 24 is remained, which defines a first central groove 252. As shown in FIG. 11, a conductor 253 is formed in the first central groove 252, and fills up the first central groove 252, so as to form the through via 25. The through via 25 has an upper surface and a lower surface opposite to the upper surface, wherein the lower surface of the through via 25 directly contacts the second conductive pad 222. However, in other embodiments, the conductor 253 can be formed only on the side wall of the first central groove 252, and defines a second central groove (not shown). After that, a second insulating layer (not shown) is further formed in the second central groove, and fills up the second central groove.

Figure 12:
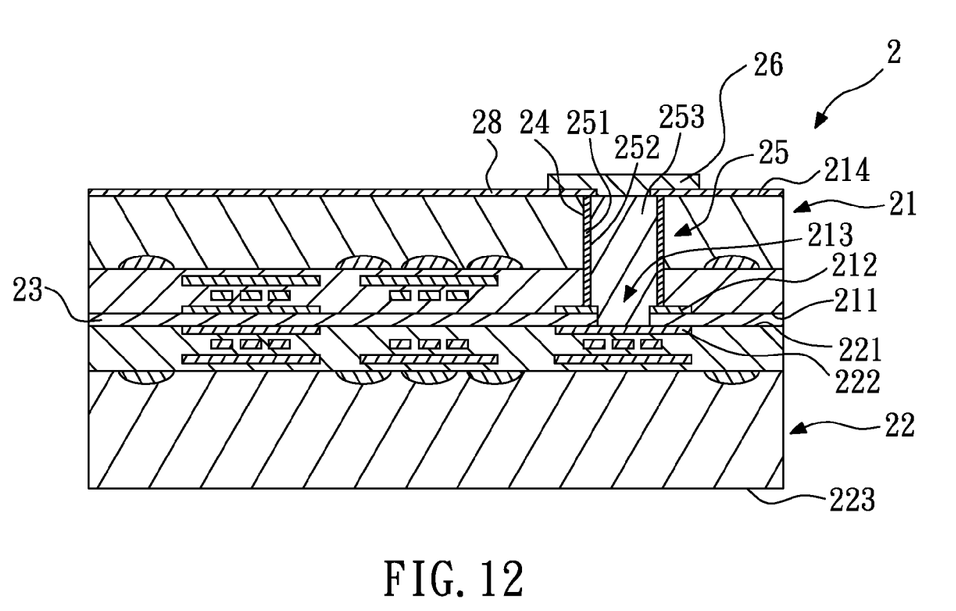

As shown in FIG. 12, a protective layer 28 and at least one electrical connecting element 26 are formed on the first back surface of the first wafer 21. The protective layer 28 is disposed on a first back surface 214 of the first wafer 21, and has an opening so as to expose the upper surface of the through via 25. The electrical connecting element 26 is disposed in the opening, and electrically connected to the through via 25, at the same time, a stacked wafer structure is formed. That is, the electrical connecting element 26 disposed on the protective layer 28 or on the first back surface of the first wafer 21, and the upper surface of the through via 25 directly contacts the electrical connecting element 26. In this embodiment, the electrical connecting element 26 is a pad. However, in other embodiments, the electrical connecting element 26 can be a redistribution layer (RDL). Preferably, the stacked wafer structure is cut, so as to form a plurality of semiconductor structures 2 according to the first embodiment of the present invention, and then the semiconductor structures 2 are disposed on a substrate (not shown) or a circuit board (not shown).

FIG. 12 shows a cross-sectional view of a semiconductor structure according to the first embodiment of the present invention. The semiconductor structure 2 comprises a first chip 21 (the first chip 21 is formed by cutting the first wafer 21, and thus they are designated by the same reference numbers), a second chip 22 (the second chip 22 is formed by cutting the second wafer 22, and thus they are designated by the same reference numbers), a groove 24, a through via 25, a protective layer 28 and at least one electrical connecting element 26. In this embodiment, the semiconductor structure 2 further comprises a bonding material 23.

The second chip 22 has a second active surface 221 and at least one second conductive pad 222. The second conductive pad 222 is exposed to the second active surface 221. In this embodiment, the bonding material 23 is disposed between the first chip 21 and the second chip 22, preferably, the material of the bonding material 23 is silicon oxide (SiO$_2$) or benzocyclobutene (BCB).

The first chip 21 is disposed on the second chip 22, and has a first active surface 211 and at least one first conductive pad 212. The first conductive pad 212 is exposed to the first active surface 211, and has at least one through hole 213. In this embodiment, the thickness of the first chip 21 is smaller than or equal to that of the second chip 22, and the second active surface 221 of the second chip 22 faces the first active surface 211 of the first chip 21. However, in other embodiments, the second chip 22 further comprises a second hack surface 223, and the second back surface 223 of the second chip 22 faces the first active surface 211 of the first chip 21, that is, in comparison with FIG. 12, the second chip 22 is reversed upside down.

The groove 24 is disposed in the first chip 21, communicates with the through hole 213 of the first conductive pad 212, and exposes the first conductive pad 212 and the second conductive pad 222. In this embodiment, the cross-sectional area of the groove 24 is smaller than or equal to those of the first conductive pad 212 and the second conductive pad 222, and the cross-sectional area of the groove 24 is larger than or equal to that of the through hole 213 of the first conductive pad 212. However, in other embodiments, under the situation described above "the second back surface 223 of the second chip 22 faces the first active surface 21.1 of the first chip 21", the groove 24 is further disposed in the second chip 22.

The through via 25 is disposed in the groove 24, and electrically connects the first conductive pad 212 and the second conductive pad 222. In this embodiment, the through via 25 comprises a first insulating layer 251 and a conductor 253. The first insulating layer 251 is disposed on the side wall of the groove 24, and defines a first central groove 252. The conductor 253 is disposed in the first central groove 252, and fills up the first central groove 252. However, in other embodiments, the conductor 253 can be formed only on the side wall of the first central groove 252, and defines a second central groove (not shown), and the through via 25 further comprises a second insulating layer (not shown). The second insulating layer is disposed in the second central groove, and fills up the second central groove.

The protective layer 28 is disposed on a first back surface 214 of the first chip 21, and has an opening so as to expose the through via 25. The electrical connecting element 26 is disposed in the opening, and electrically connected to the through via 25. In this embodiment, the electrical connecting element 26 is a pad. However, in other embodiments, the electrical connecting element 26 can be a redistribution layer (RDL).

Figure 13:
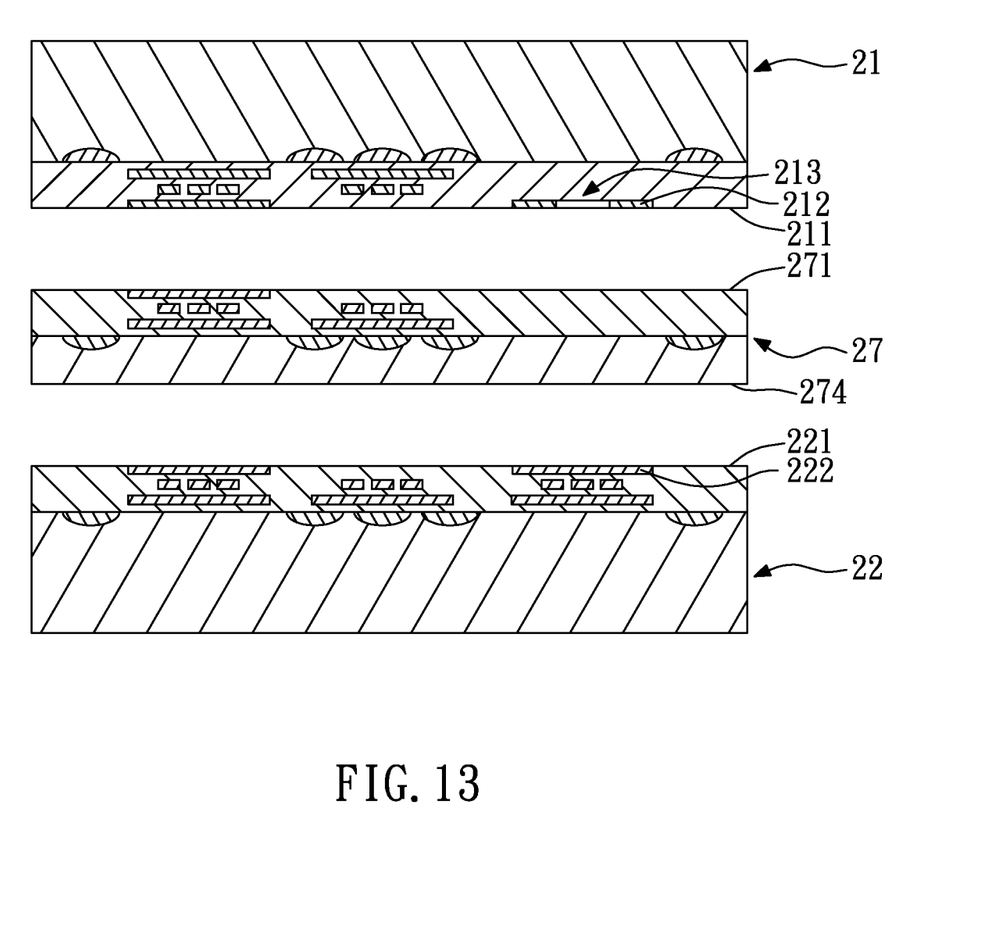
FIGS. 13 to 20 are schematic views of a method for making a semiconductor structure according to a second embodiment of the present invention.
Figure 21:
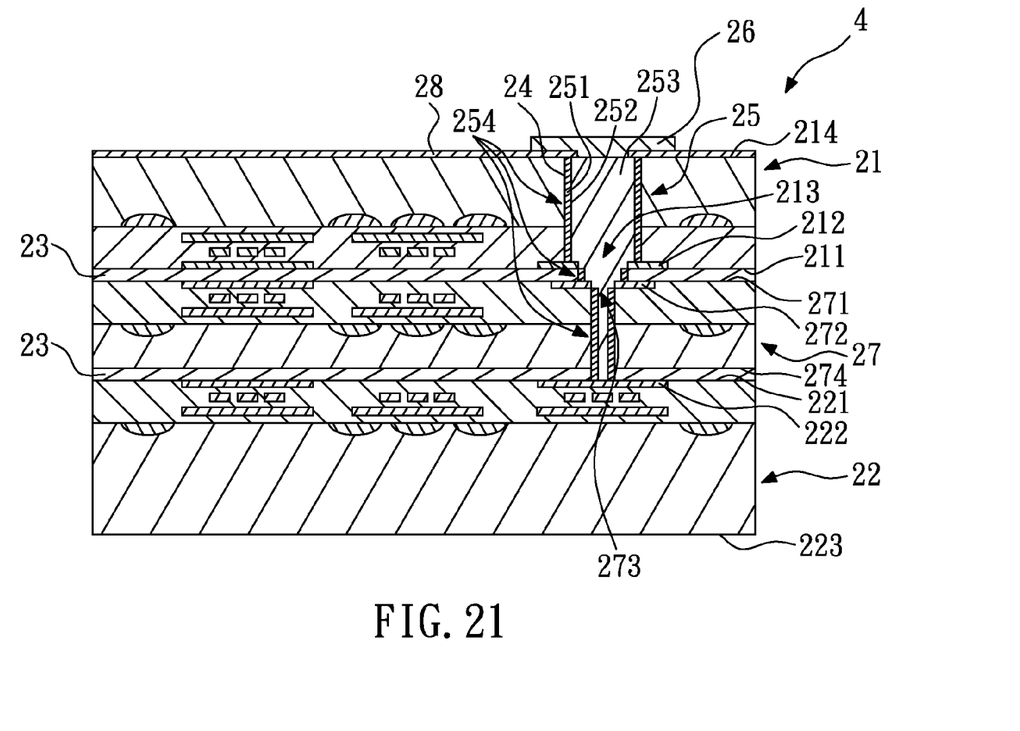
FIG. 21 is a cross-sectional view of a semiconductor structure according to a third embodiment of the present invention.
Figure 22:
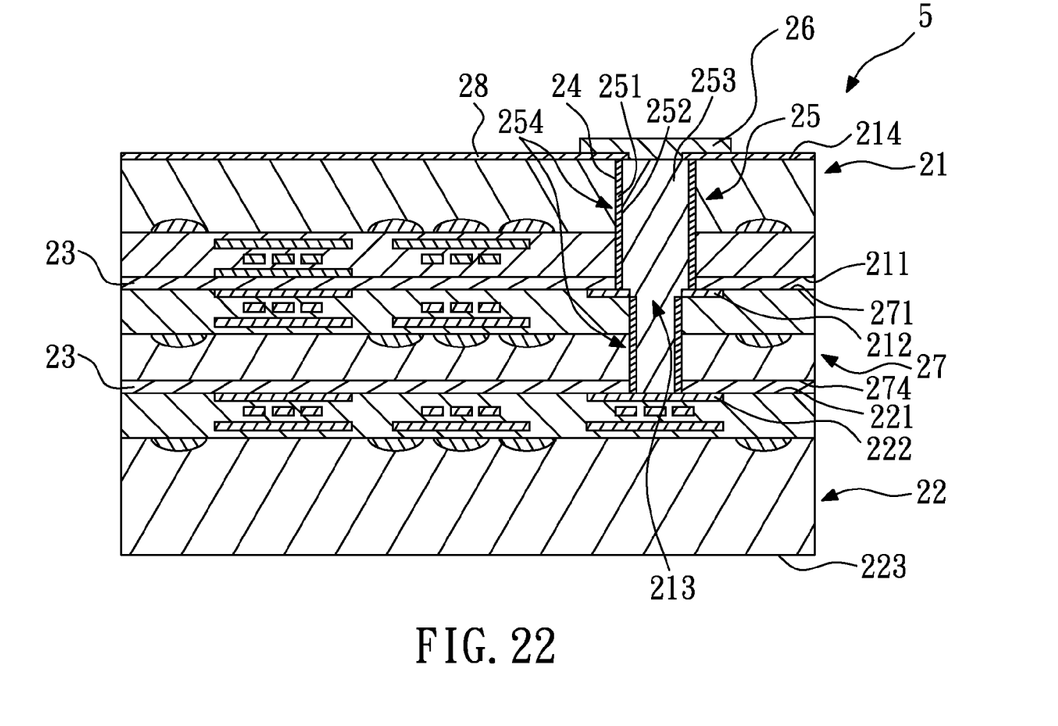
FIG. 22 is a cross-sectional view of a semiconductor structure according to a fourth embodiment of the present invention.

FIGS. 13 to 20 show schematic views of a method for making a semiconductor structure according to a second embodiment of the present invention. As shown in FIG. 13, a first wafer 21, a third wafer 27, a second wafer 22 and at least one first conductive pad 212 are provided. The first wafer 21 has a first active surface 211. The third wafer 27 has a third active surface 271. The second wafer 22 has a second active surface 221 and at least one second conductive pad 222. The second conductive pad 222 is exposed to the second active surface 221. The first conductive pad 212 has at least one through hole 213, and is disposed in the first wafer 22 or the third wafer 27. In this embodiment, the first conductive pad 212 is disposed in the first wafer 22, and exposed to the first active surface 211. However, in other embodiments, as shown in FIG. 21, at least one third conductive pad 272 is further provided. The third conductive pad 272 has a through hole 273, disposed in the third wafer 27, and exposed to the third active surface 271. Alternatively, as shown in FIG. 22, the first conductive pad 212 is disposed in the third wafer 27, and exposed to the third active surface 271.

Figure 14:
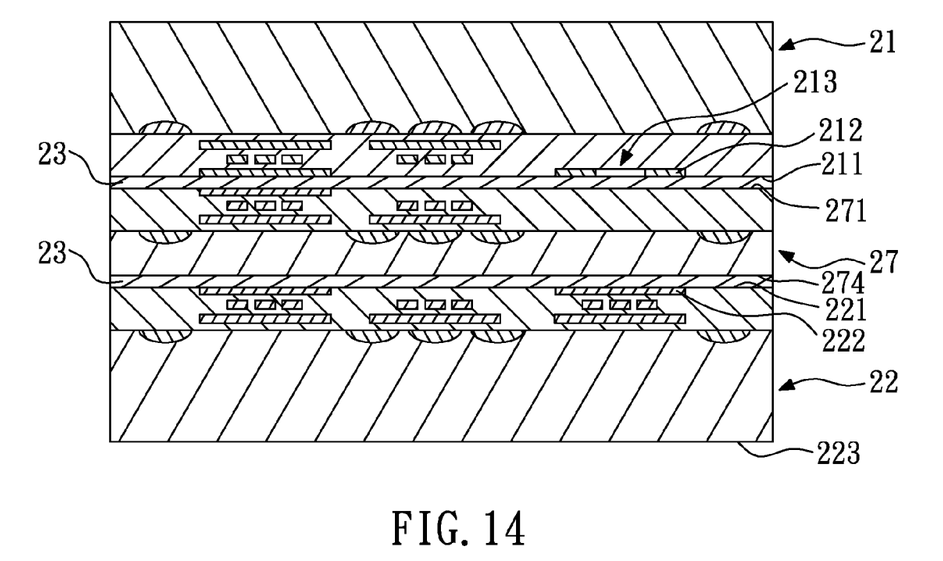

As shown in FIG. 14, the third wafer 27 is disposed on the second wafer 22, and the first wafer 21 is disposed on the third wafer 27. In this embodiment, the first wafer 21, the second wafer 22 and the third wafer 27 are connected by a bonding material 23. The second active surface 221 of the second wafer 22 and the third active surface 271 of the third wafer 27 face the first active surface 211 of the first wafer 21. However, in other embodiments, the third wafer 27 further comprises a third back surface 274. The third back surface 274 of the third wafer 27 faces the first active surface 211 of the first wafer 21, that is, in comparison with FIG. 14, the third wafer 27 is reversed upside down.

Figure 15:
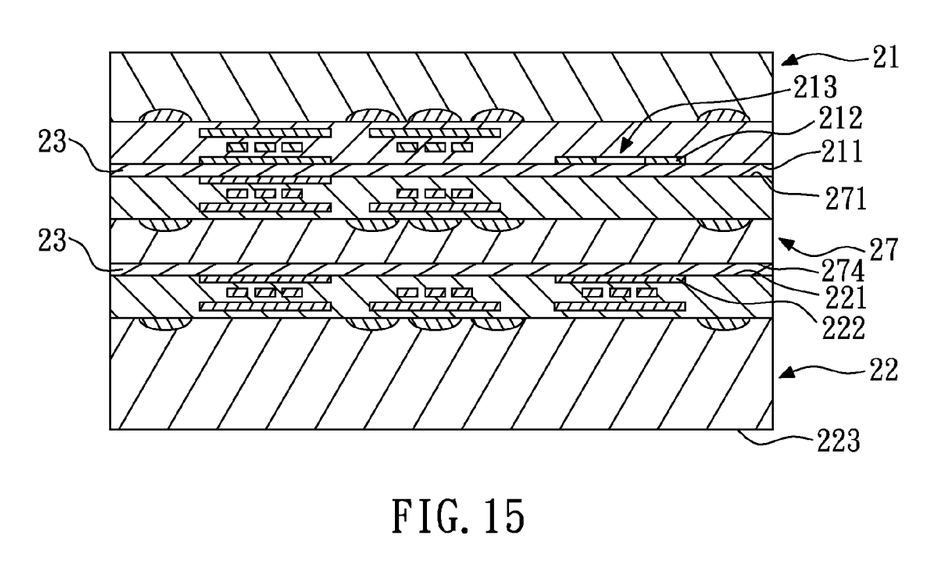
Figure 16:
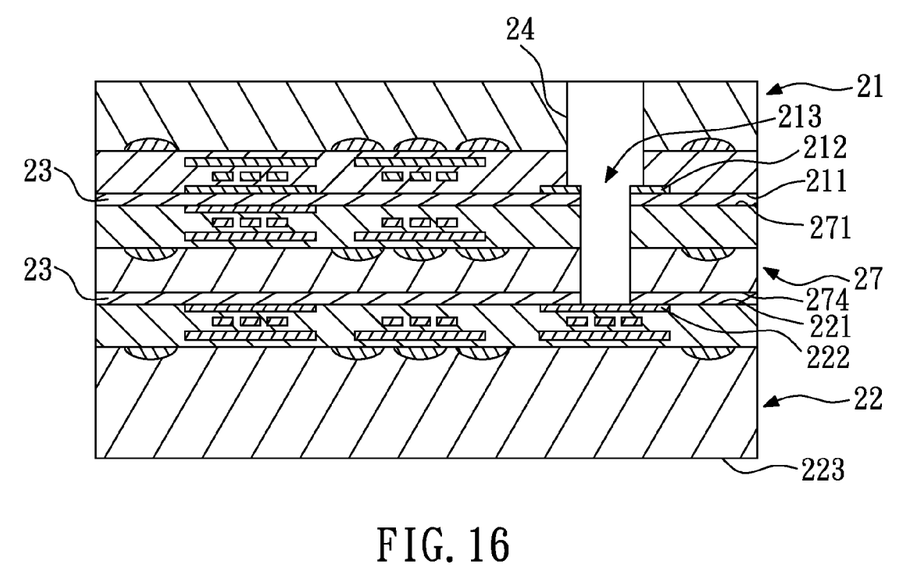
Figure 17:
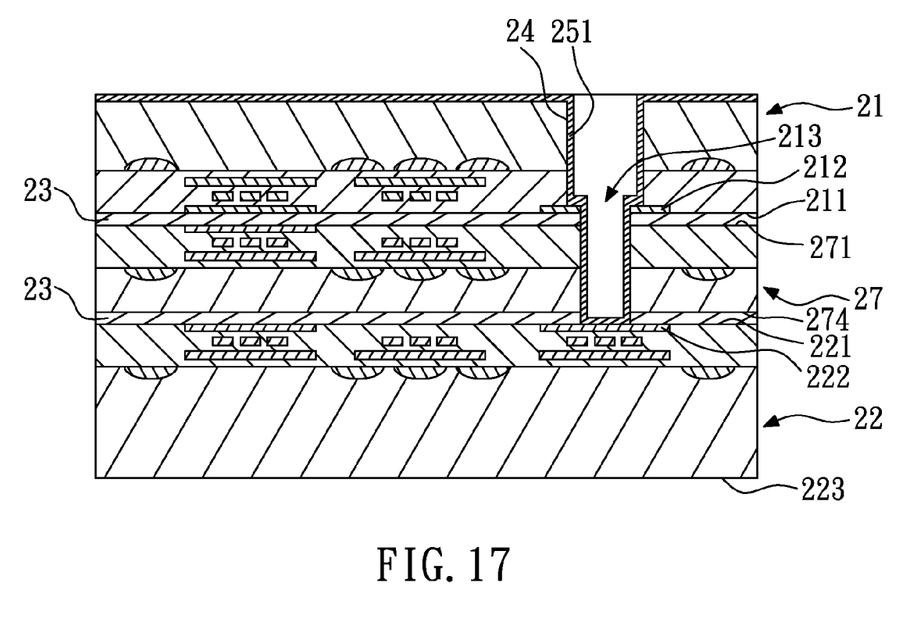
Figure 18:
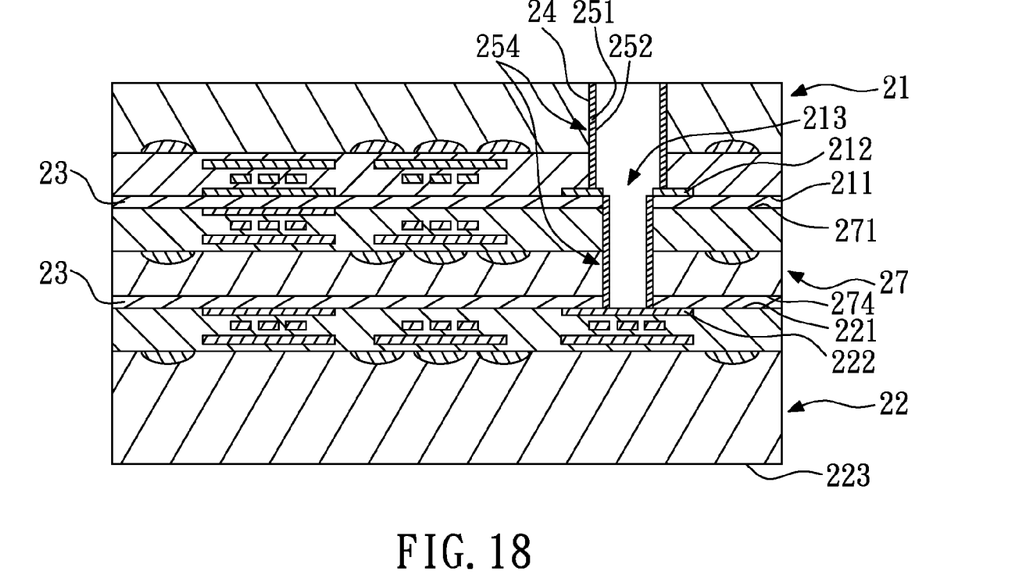
Figure 19:
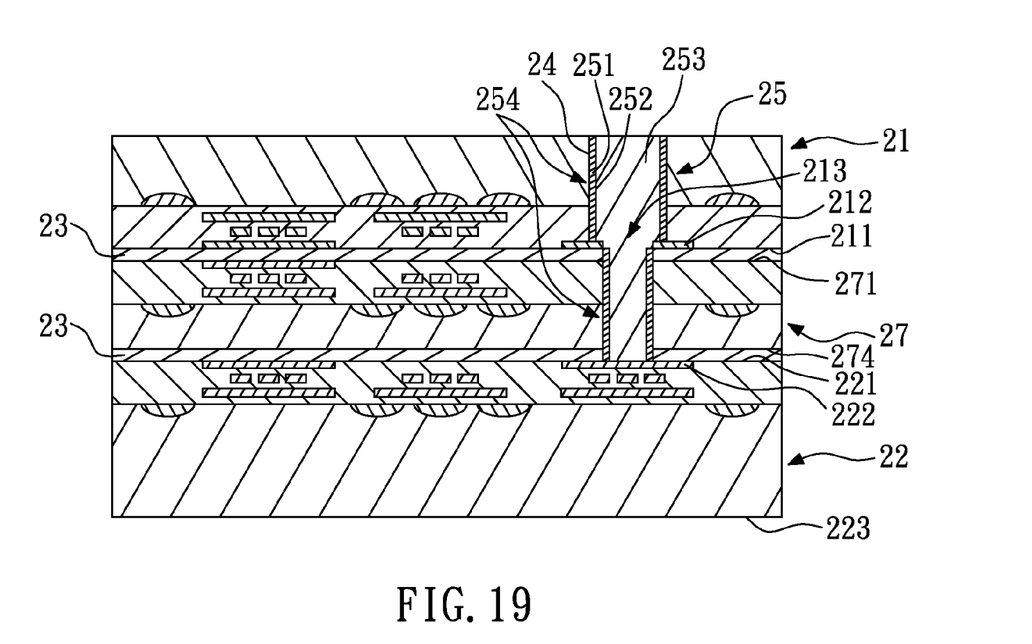

As shown in FIG. 15, preferably, part of the first wafer 21 is removed, so as to reduce the thickness of the first wafer 21. As shown in FIG. 16, part of the first wafer 21 and part of the third wafer 27 are removed, so as to form a groove 24. The groove 24 communicates with the through hole 213 of the first conductive pad 212, and exposes the first conductive pad 212 and the second conductive pad 222. As shown in FIGs, 17 to 19, a through via 25 (FIG. 19) is formed in the groove 24. The through via 25 electrically connects the first conductive pad 212 and the second conductive pad 222. In this embodiment, the method for forming the through via 25 is described below. As shown in FIG. 17, a first insulating layer 251 is formed on the first wafer 21. As shown in FIG. 18, part of the first insulating layer 251 is removed, so that the first insulating layer 251 has a plurality of sections 254, and exposes the first conductive pad 212 and the second conductive pad 222. As a result, only the first insulating layer 251 disposed on the side wail of the groove 24 is remained, which defines a first central groove 252. As shown in FIG. 19, a conductor 253 is formed in the first central groove 252, and fills up the first central groove 252. However, in other embodiments, the conductor 253 can be formed only on the side wall of the first central groove 252, and defines a second central groove (not shown). In the end, a second insulating layer (not shown) is further formed in the second central groove, and fills up the second central groove.

Figure 20:
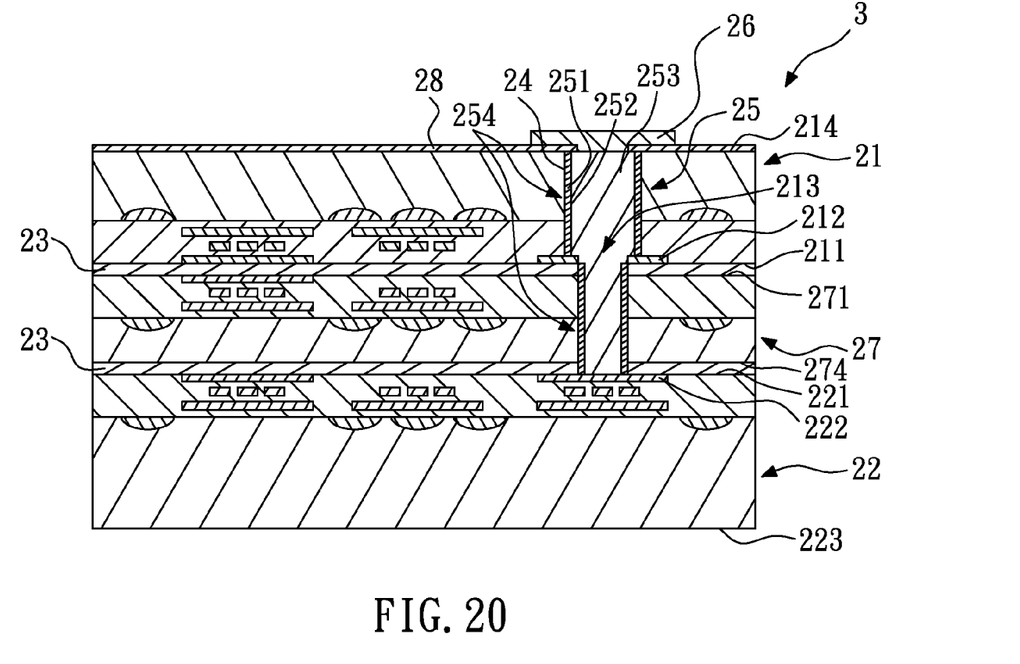

As shown in FIG. 20, a protective layer 28 and at least one electrical connecting element 26 are formed on the first wafer 21. The protective layer 28 is disposed on a first back surface 214 of the first wafer 21, and has an opening so as to expose the through via 25. The electrical connecting element 26 is disposed in the opening, and electrically connected to the through via 25, at the same time, a stacked wafer structure is formed. Preferably, the stacked wafer structure is cut, so as to form a plurality of semiconductor structures 3 according to the second embodiment of the present invention, and then the semiconductor structures 3 are disposed on a substrate (not shown) or a circuit board (not shown).

FIG. 20 shows a cross-sectional view of a semiconductor structure according to the second embodiment of the present invention. The semiconductor structure 3 comprises a first chip 21 (the first chip 21 is formed by cutting the first wafer 21, and thus they are designated by the same reference numbers), a second chip 22 (the second chip 22 is formed by cutting the second wafer 22, and thus they are designated by the same reference numbers), a third chip 27 (the third chip 27 is formed by cutting the third wafer 27, and thus they are designated by the same reference numbers), at least one first conductive pad 212, a groove 24, a through via 25, a protective layer 28 and at least one electrical connecting element 26. In this embodiment, the semiconductor structure 3 further comprises a bonding material 23. The second chip 22 has a second active surface 221 and at least one second conductive pad 222. The second conductive pad 222 is exposed to the second active surface 221. The third chip 27 is disposed on the second chip 22, and has a third active surface 271. The first chip 21 is disposed on the third chip 27, and has a first active surface 211.

In this embodiment, the thickness of the first chip 21 is smaller than or equal to those of the second chip 22 and the third chip 27. The second active surface 221 of the second chip 22 and the third active surface 271 of the third chip 27 face the first active surface 211 of the first chip 21. However, in other embodiments, the second chip 22 further comprises a second back surface 223. The third chip 27 further comprises a third back surface 271. The second back surface 223 of the second chip 22 and the third back surface 271 of the third chip 27 face the first active surface 211 of the first chip 21, that is, in comparison with FIG. 20, the second chip 22 and the third chip 27 are reversed upside down.

In this embodiment, the bonding material 23 is disposed between the first chip 21 and the third chip 27, and disposed between the second chip 22 and the third chip 27, and the material of the bonding material 23 is silicon oxide ($SiO_2$) or benzocyclobutene (BCB). The first conductive pad 212 has at least one through hole 213, and is disposed in the first chip 21 or the third chip 27. In this embodiment, the first conductive pad 212 is disposed in the first chip 21, and exposed to the first active surface 211.

The groove 24 is disposed in the first chip 21 and the third chip 27, communicates with the through hole 213 of the first conductive pad 212, and exposes the first conductive pad 212 and the second conductive pad 222. In this embodiment, the cross-sectional area of the groove 24 is smaller than or equal to those of the first conductive pad 212 and the second conductive pad 222, and the cross-sectional area of the groove 24 is larger than or equal to that of the through hole 213 of the first conductive pad 212. However, in other embodiments, under the situation described above "the second back surface 223 of the second chip 22 faces the first active surface 211 of the first chip 21", the groove 24 is further disposed in the second chip 22.

The through via 25 is disposed in the groove 24, and electrically connects the first conductive pad 212 and the second conductive pad 222. In this embodiment, the through via 25 comprises a first insulating layer 251 and a conductor 253. The first insulating layer 251 is disposed on the side wall of the groove 24, has a plurality of sections 254, exposes the first conductive pad 212, and defines a first central groove 252. The conductor 253 is disposed in the first central groove 252, and fills up the first central groove 252. However, in other embodiments, the conductor 253 can be formed only on the side wall of the first central groove 252, and defines a second central groove (not shown), and the through via 25 further comprises a second insulating layer (not shown). The second insulating layer is disposed in the second central groove, and fills up the second central groove.

The protective layer 28 is disposed on a first back surface 214 of the first chip 21, and has an opening so as to expose the through via 25. The electrical connecting element 26 is disposed in the opening, and electrically connected to the through via 25. In this embodiment, the electrical connecting element 26 is a pad. However, in other embodiments, the electrical connecting element 26 can be a redistribution layer (RDL).

FIG. 21 shows a cross-sectional view of a semiconductor structure according to a third embodiment of the present invention. The semiconductor structure 4 according to the third embodiment is substantially the same as the semiconductor structure 3 (FIG. 20) according to the second embodiment, and the same elements are designated by the same reference numbers. The difference between the semiconductor structure 4 and the semiconductor structure 3 is that the semiconductor structure 4 further comprises a third conductive pad 272. The third conductive pad 272 has at least one through hole 273, is disposed in the third chip 27, and exposed to the third active surface 271. The groove 24 further communicates with the through hole 273 of the third conductive pad 272, and further exposes the third conductive pad 272. The cross-sectional area of the groove 24 is smaller than or equal to that of the third conductive pad 272, and the cross-sectional area of the groove 24 is larger than or equal to that of the through hole 273 of the third conductive pad 272.

FIG. 22 shows a cross-sectional view of a semiconductor structure according to a fourth embodiment of the present invention. The semiconductor structure 5 according to the fourth embodiment is substantially the same as the semiconductor structure 3 (FIG. 20) according to the second embodiment, and the same elements are designated by the same reference numbers. The difference between the semiconductor structure 5 and the semiconductor structure 3 is that the first conductive pad 212 of the semiconductor structure 5 is disposed in the third chip 27, and exposed to the third active surface 271.

Therefore, in the present invention, the wafers (the first wafer 21 and the second wafer 22, or, the second wafer 22 and the third wafer 27, or, the first wafer 21, the second wafer 22 and the third wafer 27) or the chips (the first chip 21 and the second chip 22, or, the second chip 22 and the third chip 27, or, the first chip 21, the second chip 22 and the third chip 2) are penetrated and electrically connected by forming only one through via 25. The method according to the present invention leads to a simplified process and a low manufacturing cost compared with the method in prior art, since the wafers are connected after the through via 115 are formed in each wafer 11. Moreover, in the present invention, the wafers and the chips are connected directly or by a bonding material 23, and a plurality of bumps are not needed. Therefore, the present invention avoids the disadvantage that the underfill 12 can not completely encapsulate the bumps 116 (FIG. 1), and thus the yield rate is increased.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A method for making a semiconductor structure, comprising:
   (a) providing a first wafer and a second wafer, wherein the first wafer has a first active surface, at least one first conductive pad, and a first back surface opposite to the first active surface, the first conductive pad is exposed to the first active surface, and has at least one through hole, the second wafer has a second active surface and at least one second conductive pad, the second conductive pad is exposed to the second active surface;
   (b) disposing the first wafer on the second wafer;
   (c) removing part of the first wafer, so as to form a groove, wherein the groove communicates with the through hole of the first conductive pad, and exposes the first conductive pad and the second conductive pad;

(d) forming a through via in the groove, wherein the through via electrically connects the first conductive pad and the second conductive pad, wherein the through via has opposite upper and lower surfaces, and the lower surface of the through via directly contacts the second conductive pad; and (e) forming at least one electrical connecting element on the first back surface of the first wafer, wherein the upper surface of the through via directly contacts the electrical connecting element.

2. The method as claimed in claim 1, wherein in the step (b), the first wafer and the second wafer are connected by a bonding material.

3. The method as claimed in claim 1, wherein in the step (c), the cross-sectional area of the groove is smaller than or equal to those of the first conductive pad and the second conductive pad, and the cross-sectional area of the groove is larger than or equal to that of the through hole of the first conductive pad.

4. The method as claimed in claim 1, wherein in the step (e), a stacked wafer structure is formed at the same time, and after the step (e), the method further comprises a step of cutting the stacked wafer structure, so as to form a plurality of semiconductor structures.

5. A method for making a semiconductor structure, comprising:

(a) providing a first wafer, a third wafer, a second wafer and at least one first conductive pad, wherein the first wafer has a first active surface and a first back surface opposite to the first active surface, the third wafer has a third active surface, the second wafer has a second active surface and at least one second conductive pad, the second conductive pad is exposed to the second active surface, the first conductive pad has at least one through hole and is disposed in the first wafer or the third wafer;

(b) disposing the third wafer on the second wafer, and disposing the first wafer on the third wafer;

(c) removing part of the first wafer and part of the third wafer, so as to form a groove, wherein the groove communicates with the through hole of the first conductive pad, and exposes the first conductive pad and the second conductive pad;

(d) forming a through via in the groove, wherein the through via electrically connects the first conductive pad and the second conductive pad, wherein the through via has opposite upper and lower surfaces, and the lower surface of the through via directly contacts the second conductive pad; and (e) forming at least one electrical connecting element on the first back surface of the first wafer, wherein the upper surface of the through via directly contacts the electrical connecting element.

6. The method as claimed in claim 5, wherein in the step (a), the first conductive pad is disposed in the third wafer, and exposed to the third active surface.

7. The method as claimed in claim 5, wherein in the step (a), the first conductive pad is disposed in the first wafer, and exposed to the first active surface.

8. The method as claimed in claim 7, wherein in the step (a), further comprises a step of providing at least one third conductive pad having a through hole, the third conductive pad is disposed in the third wafer, and exposed to the third active surface.

9. The method as claimed in claim 5, wherein in the step (b), the first wafer, the second wafer and the third wafer are connected by a bonding material, the third wafer is disposed on the second wafer, and the first wafer is disposed on the third wafer.

10. The method as claimed in claim 5, wherein in the step (c), the cross-sectional area of the groove is smaller than or equal to those of the first conductive pad and the second conductive pad, and the cross-sectional area of the groove is larger than or equal to that of the through hole of the first conductive pad.

11. The method as claimed in claim 5, wherein in the step (d), the through via comprises a first insulating layer, the first insulating layer is disposed on the side wall of the groove, has a plurality of sections, and exposes the first conductive pad.

12. The method as claimed in claim 5, wherein in the step (e), a stacked wafer structure is fowled at the same time, and after the step (e), the method further comprises a step of cutting the stacked wafer structure, so as to form a plurality of semiconductor structures.

* * * * *